United States Patent
Liu (10) Patent No.: US 7,106,920 B2
(45) Date of Patent: Sep. 12, 2006

(54) LASER ARRAY FOR GENERATING STABLE MULTI-WAVELENGTH LASER OUTPUTS

(76) Inventor: Zhongshan Liu, 8125 Haning Dr., Plano, TX (US) 75025

( * ) Notice: Subject to any disclaimer, the term of this patent is extended or adjusted under 35 U.S.C. 154(b) by 398 days.

(21) Appl. No.: 10/276,926

(22) PCT Filed: Nov. 13, 2001

(86) PCT No.: PCT/US01/43059

§ 371 (c)(1),
(2), (4) Date: Nov. 18, 2002

(87) PCT Pub. No.: WO02/39166

PCT Pub. Date: May 16, 2002

(65) Prior Publication Data

US 2003/0133485 A1   Jul. 17, 2003

(51) Int. Cl.
G02B 6/12 (2006.01)
H01S 3/04 (2006.01)
(52) U.S. Cl. .................. 385/14; 385/129; 385/130; 385/131; 385/37; 372/43.01; 372/50; 372/102
(58) Field of Classification Search .................. 385/14, 385/88, 129, 130, 131, 132, 37; 372/43, 372/50, 102, 43.01
See application file for complete search history.

(56) References Cited

U.S. PATENT DOCUMENTS

| | | | |
|---|---|---|---|
| 3,814,498 A * | 6/1974 | Tomlinson et al. ........... 385/37 |
| 4,645,293 A * | 2/1987 | Yoshida et al. ............... 385/40 |
| 4,873,691 A | 10/1989 | Uomi et al. |
| 4,885,753 A | 12/1989 | Okai et al. |
| 5,163,058 A | 11/1992 | Farries et al. |
| 5,216,680 A | 6/1993 | Magnusson et al. |
| 5,333,144 A * | 7/1994 | Liedenbaum et al. .. 372/29.021 |
| 5,511,142 A * | 4/1996 | Horie et al. ................. 385/129 |
| 5,598,300 A | 1/1997 | Magnusson et al. |
| 5,677,920 A * | 10/1997 | Waarts et al. .................. 372/6 |
| 5,818,986 A * | 10/1998 | Asawa et al. ................. 385/24 |
| 5,910,962 A | 6/1999 | Pan et al. |
| 6,061,369 A | 5/2000 | Conradi |
| 6,154,480 A | 11/2000 | Magnusson et al. |
| 6,215,928 B1 | 4/2001 | Friesem et al. |
| 6,263,127 B1 | 7/2001 | Dragone et al. |
| 6,289,032 B1 | 9/2001 | Fay et al. |
| 2003/0133485 A1* | 7/2003 | Liu .............................. 372/50 |

FOREIGN PATENT DOCUMENTS

WO   WO 02/43202 A1   5/2002

OTHER PUBLICATIONS

S.S. Weng and R. Magnussom; Theory and Applications of Guided-Mode Resonsnce Filters; Applied Optics; vol. 32, No. 14, May 10, 1993.
S.S. Wang and R. Magnusson; Theory and Application of Guided-mode Resonance Filters; Applied Optics; vol. 32 No. 14 (May 10, 1993).

* cited by examiner

*Primary Examiner*—Brian M. Healy
(74) *Attorney, Agent, or Firm*—A Z Patent Law Firm (57) ABSTRACT

A multi-wavelength laser array is achieved by using a wavelength selectable optical device as a feedback mirror for a plurality of lasers. The wavelength of reflected light from the optical device depends upon the parameters in the local reflection positions of the optical device along the direction as determined by guided-mode resonance. Thus, the multi-wavelength laser array is able to emit a plurality of laser beams with desired wavelengths, each within the gain curve of its active element.

41 Claims, 7 Drawing Sheets

LASER ARRAY FOR GENERATING STABLE MULTI-WAVELENGTH LASER OUTPUTS

FIELD OF INVENTION

The present invention relates generally to optical networks, and more particularly to multi-wavelength laser technology.

BACKGROUND OF THE INVENTION

Multi-wavelength lasers (MWLs) are useful in providing multiple-channel light sources for optical networks, especially for dense wavelength division multiplexing (DWDM) systems. The desirable features of MWLs used for DWDM systems include compact design, high stability in the output wavelengths and wavelength spacing, reasonable output power, wide wavelength range and narrow linewidth for a large channel capacity, convenience of modulating individual wavelength at a high rate, and easiness of manufacture. In addition, the wavelength locking mechanisms of laser sources should be as simple as possible. No existing MWL provides all those features largely because of the limitations in current laser technologies.

A number of MWL technologies have been investigated, and they can be generally classified into two types: MWL array and shared-gain MWLs. An MWL array consists of a row of single-wavelength lasers such as distributed feedback (DFB) lasers and distributed Bragg reflector (DBR) lasers. Each DFB or DBR laser in the laser array can be tuned and locked in a channel, and modulated individually.

One of unsolved problems with DFB or DBR MWLs is uneven wavelength drifting that can cause cross talks. The output wavelength of a channel depends upon the combined effects of junction temperature and injection currents (diode pumping current, wavelength tuning current, and phase shifting current). The channel tuning mechanisms of current MWL arrays are very complex. Since the output wavelength of an individual laser in the array is a function of its junction temperature, any fluctuation in the temperature of the diode will cause its output wavelength to drift. To keep output wavelengths locked in their channels, it is essential to maintain the junction temperature constant. Heat sinks capable of precisely controlling temperature are ordinarily used to keep output wavelengths stable. Also, the costs for making such laser arrays are very high.

In shared-gain MWLs, laser channels share one gain region by integrating multi-resonance feedback elements with one gain medium, thereby yielding a number of output wavelengths. One of the advantages of this design is stable output wavelength spacing even when all output wavelengths drift simultaneously. It is more difficult to modulate individual channels for most of the existing shared-gain MWLs than for MWL arrays. U.S. Pat. No. 6,289,032 discloses a self-collimating MWL laser, which simultaneously permits broad-beam collimation and monomode operation, with simultaneous emission of multiple wavelengths from a single aperture. While this design results in stable wavelength spacing, it does not allow direct or internal modulation of each individual wavelength.

DISCLOSURE OF THE INVENTION

The objective of this invention is to provide a large channel-capacity laser source with high thermal and electrical stability in the output wavelengths for optical networks such as DWDM optical fiber communication systems.

The MWL array disclosed in this invention has many advantages over conventional DFB and DBR lasers. It is simple in its structure, stable in wavelengths and channel spacing, easy to use, and cost-effective in production. In addition, the MWL laser array can have a selectable bandwidth as broad as the full gain spectrum of the active medium.

A unique feature of this invention is the use of a wavelength selectable optical device (FIG. 1b) as a common feedback mirror of the laser cavities. The optical device 10 contains a substrate 11, a grating layer 14, and a waveguide layer 13, which is non-uniform in its thickness or refractive index along one direction of the layer. When the optical device 10 is used as a common feedback mirror of a laser array (FIG. 4), it can feed lights back to the active elements 16 with different wavelengths at different sections along its non-uniformity direction, as determined by guided-mode resonance. The optical device can also function as output couplers for generating multi-wavelength outputs.

The principle upon which the wavelength selectable optical device works as a wavelength selectable feedback mirror is guided-mode resonance. Guided-mode resonance occurs only in waveguide gratings where guided modes that would be supported by the waveguide without refractive index modulation are possible. However, since there is a periodic modulation or perturbance of the refractive index in or around the waveguide layer, the propagation constant $\beta_i$ (See following Equation 2) becomes a complex number and the imaginary part of $\beta_i$ cannot be neglected. Thus, the waveguide modes cannot propagate without loss in the waveguide. This structure is called a "leaky" structure because the energy from the guided-mode does not propagate within the waveguide but leaks out of the structure. In this "leaky" structure, the energy of the incident optical wave is "fed" by the diffractive element into the periodically modulated or perturbed waveguide, then the "leaky" mode is coupled into certain space-harmonic waves, which are propagating waves. However, due to the phase-matching conditions, the "feeding" is strongly selective with respect to the incident wavelength, the angle of incidence, and the polarization state of the incident wave. Only the energy from the incident wave that strictly satisfies the resonance conditions can be fed into the structure. For the visible and near infrared range, the grating period $\Lambda$ is in most cases in the sub-micron scale to allow only zero diffraction orders to propagate in reflection and transmission while all higher order waves are cut off. In this case, 100% reflection can be obtained at a desired narrow wavelength range. The bandwidth is typically less than a few nanometers while side bands have low reflectivity. Thus, the optical device can be used as a wavelength selectable mirror.

The guided-mode resonance phenomenon is well described by the rigorous coupled-wave theory (S. S. Wang, R. Magnusson, J. S. Bagby, and M. G. Moharam, "Guided-mode resonances in planar dielectric-layer diffraction gratings," J. Opt. Soc. Am. A, Vol. 8, pp. 1470–1475, August 1990; S. S. Wang and R. Magnusson, "Multilayer waveguide-grating filters," Appl. Opt., Vol. 34, pp. 2414–2420, May 1995; and T. K. Gaylord and M. G. Moharam, "Analysis and applications of optical diffraction by gratings," Proc. IEEE, Vol. 73, pp. 894–937, May 1985). The coupled-wave equations governing wave propagation in the waveguide can be expressed as $$\frac{d^2 \hat{S}_i(z)}{dz^2} + [k^2 \varepsilon_g - k^2(\sqrt{\varepsilon_g} \sin\theta - i\frac{\lambda}{\Lambda})^2]\hat{S}_i(z) + \frac{1}{2}k^2 \Delta\varepsilon[\hat{S}_{i+1}(z) + \hat{S}_{i-1}(z)] = 0, \quad (1)$$

where $\hat{S}_i(z)$ is the amplitude of the inhomogeneous plane wave of the i-th space harmonic, $k=2\pi/\lambda$ is the free space wave number, $\Delta\epsilon=(\epsilon_H-\epsilon_L)/2$ is the permittivity modulation, $\epsilon_g=\epsilon_g(x)=(\epsilon_H+\epsilon_L)/2$ is the average permittivity of the waveguide layer, $\Lambda$ is the grating period, and $\lambda$ is the free-space wavelength. As $\Delta\epsilon \rightarrow 0$ (weak modulation), allowing $$\beta_i = k(\epsilon_g^{1/2} \sin\theta - i\lambda/\Lambda), \quad (2)$$

equation (1) becomes $$\frac{d^2 \hat{S}_i(z)}{dz^2} + (k^2 \varepsilon_g - \beta_i^2)\hat{S}_i(z) = 0. \quad (3)$$

Equation (3) has the same appearance as the wave equation associated with an unmodulated slab waveguide. Similar to the eigenvalue of the unmodulated slab waveguide, the corresponding eigenvalue equation of the modulated waveguide is, in this limit, $$\tan(\kappa_i d) = \frac{\kappa_i(\gamma_i + \delta_i)}{\kappa_i^2 - \gamma_i \delta_i} \quad (4)$$

for TE polarization, and is $$\tan(\kappa_i d) = \frac{\varepsilon_g \kappa_i(\varepsilon_3 \gamma_i + \varepsilon_1 \delta_i)}{\varepsilon_1 \varepsilon_3 \kappa_i^2 - \varepsilon_g^2 \gamma_i \delta_i} \quad (5)$$

for TM polarization, where $$\kappa_i = \sqrt{\varepsilon_g k^2 - \beta_i^2}, \gamma_i = \sqrt{\beta_i^2 - \varepsilon_1 k^2}, \text{ and } \delta_i = \sqrt{\beta_i^2 - \varepsilon_3 k^2}.$$

Equations (4) and (5) can be used to predict approximately the wavelength and incident angle location of the resonance for a given structure. The propagation constant, $\beta_i$, of the waveguide grating in the limit of $\Delta\epsilon \rightarrow 0$ is thus determined explicitly by the basic waveguide grating parameters, grating period $\Lambda$, average permittivity of the waveguide layer, $\epsilon_g$, incident angle, $\theta$, the free space wavelength, $\lambda$, and mode index i.

The spectral response of a guided-mode resonant reflective filter predicted by this theory is very close to the ones obtained experimentally (See "High-efficiency guided-mode resonance filter", Z. S. Liu, S. Tibuleac, D. Shin, P. P. Young, and R. Magnusson, Optics Letters, Vol. 23, No. 19, Oct. 1, 1998). The reflection wavelength of a wavelength selectable optical device is determined by parameters such as grating periods, grating fill factors, refractive indices (the square of permibility) of the substrate, waveguide, and grating layers, input medium, and the thickness of the waveguide layer at the local position where the resonant modes occur. Any changes in these parameters will cause a shift in the wavelength of the peak reflection. Thus, when those parameters are non-uniform along the same direction of the waveguide layer, the wavelength selectable optical device is able to reflect different wavelengths at different positions along the direction. The most convenient parameters for achieving various reflection wavelengths are the thickness of the waveguide layer and the grating period of the grating. Making a waveguide layer with non-uniform refractive indices is more complicated, but existing techniques can be modified for this purpose.

Figure 1:
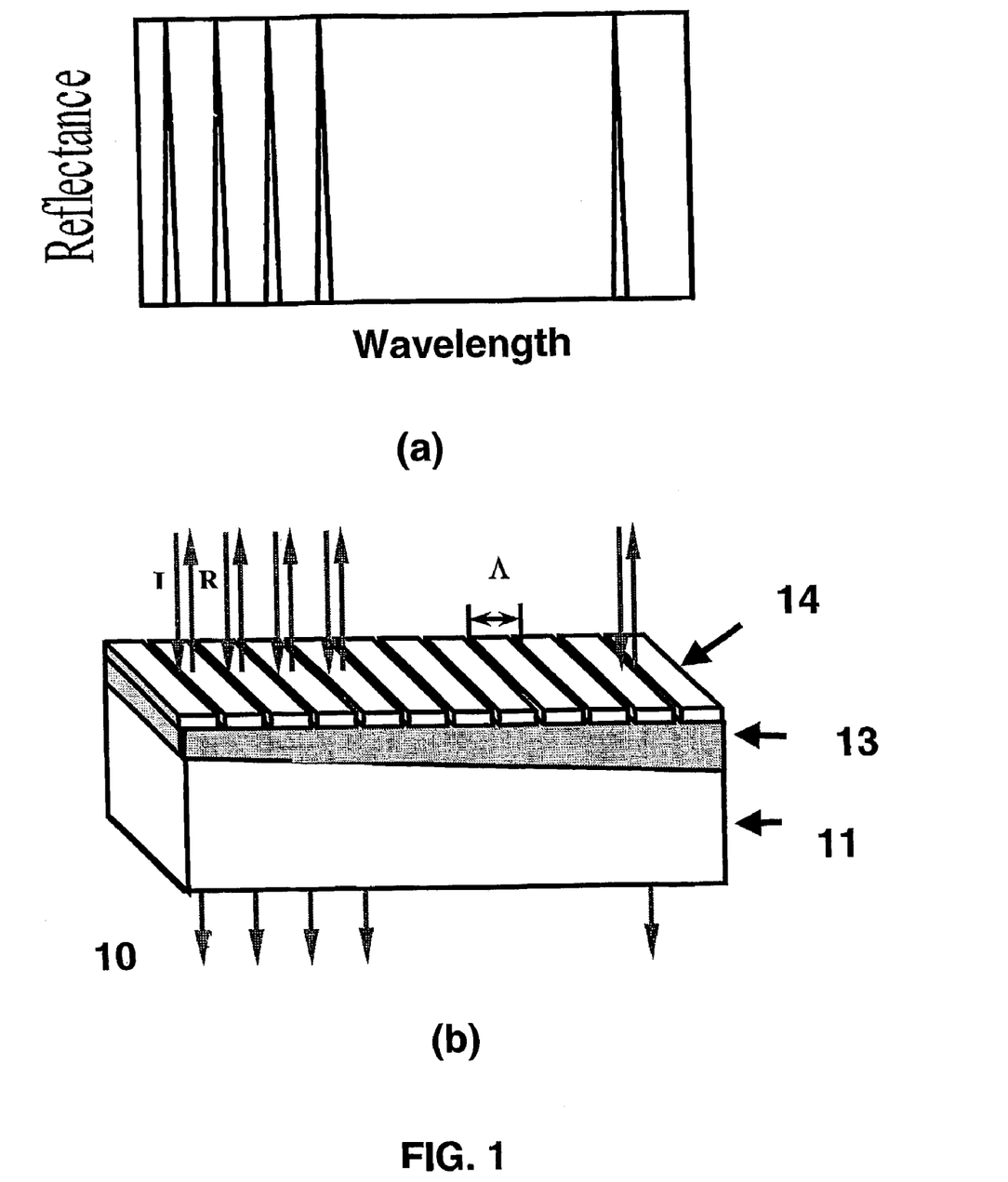
FIG. 1 illustrates a schematic view of a wavelength selectable optical device.
Figure 2:
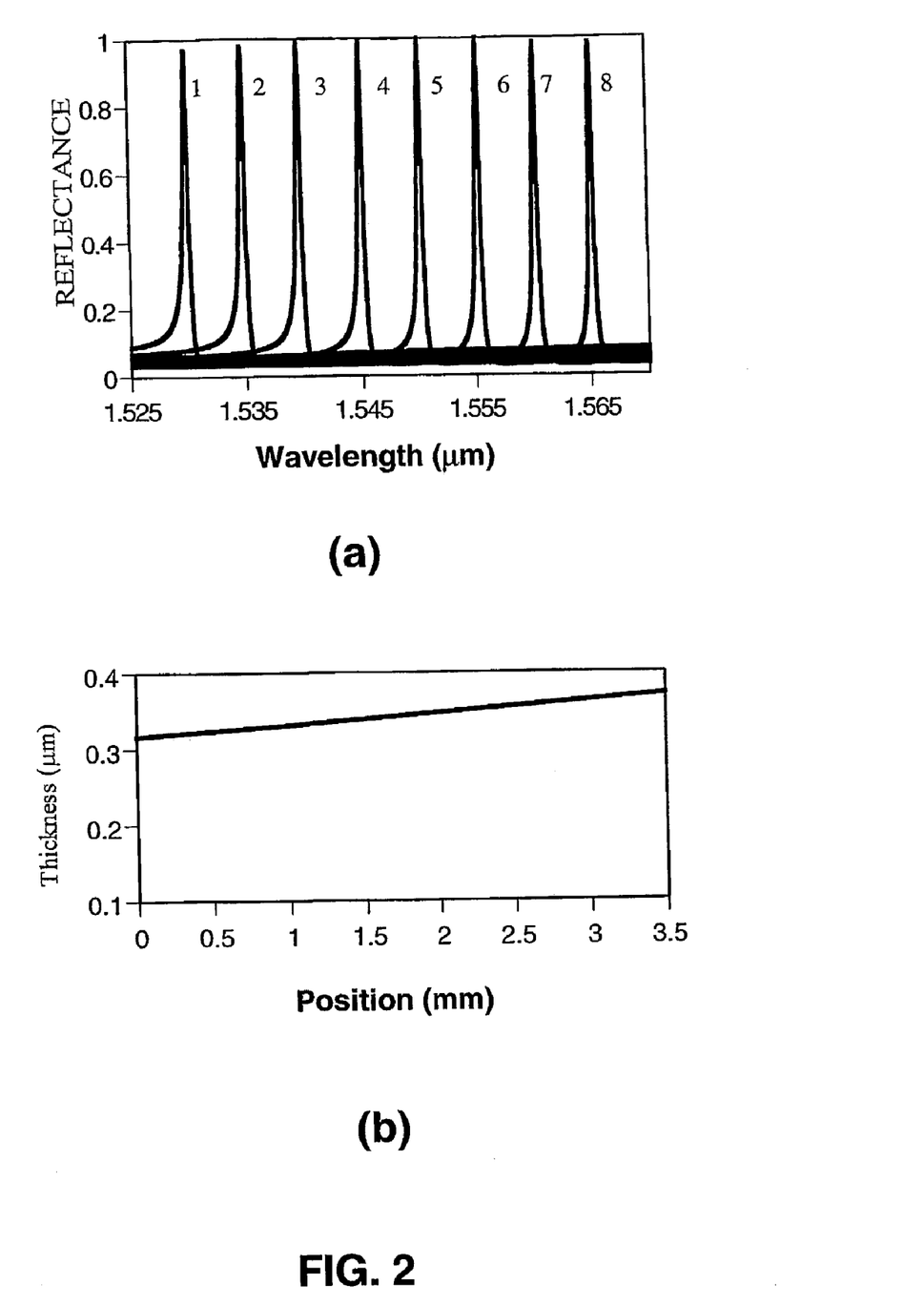
FIG. 2 illustrates reflection spectra predicted for a wavelength selectable optical device containing a waveguide layer of non-uniform thickness.

FIG. 1a illustrates a qualitative relationship between the reflection peak wavelengths of the optical device and its local position. FIG. 2a shows theoretically predicted reflection spectra for an optical device containing a waveguide layer of non-uniform thickness using the following device parameters: refractive index of substrate or spacer=1.47, refractive index of the waveguide layer=2.0, refractive index of grating=1.5, refractive index of the media above the surface-relief grating=1.0, thickness of grating=50 nm, grating period=920 nm, the separation distance between any two adjacent points=0.5 mm, thickness of the waveguide layer is from 317 nm to 371 nm, corresponding to the position from 0 to 3.5 mm in the optical device, as shown FIG. 2b. The incident lights and reflected lights are TE (e.g., the electric vector normal to the grating vector) polarized. For convenience, only eight reflection spectra for eight evenly separated points at the optical device are computed. As shown in FIG. 2a all eight reflection peaks are evenly separated in the wavelength range from 1530 nm to 1565 nm. However, all wavelengths from 1530 nm to 1565 nm are available as the peak reflection wavelengths while their individual output wavelength spacing for a specific optical device may be constrained by the geometry of active elements with which the optical device is used. For a given number of active elements in a defined geometrical arrangement in a laser array, any wavelength can be assigned, as the peak reflection wavelength, to any of the active elements by designing the profile of non-uniform parameters.

Figure 3:
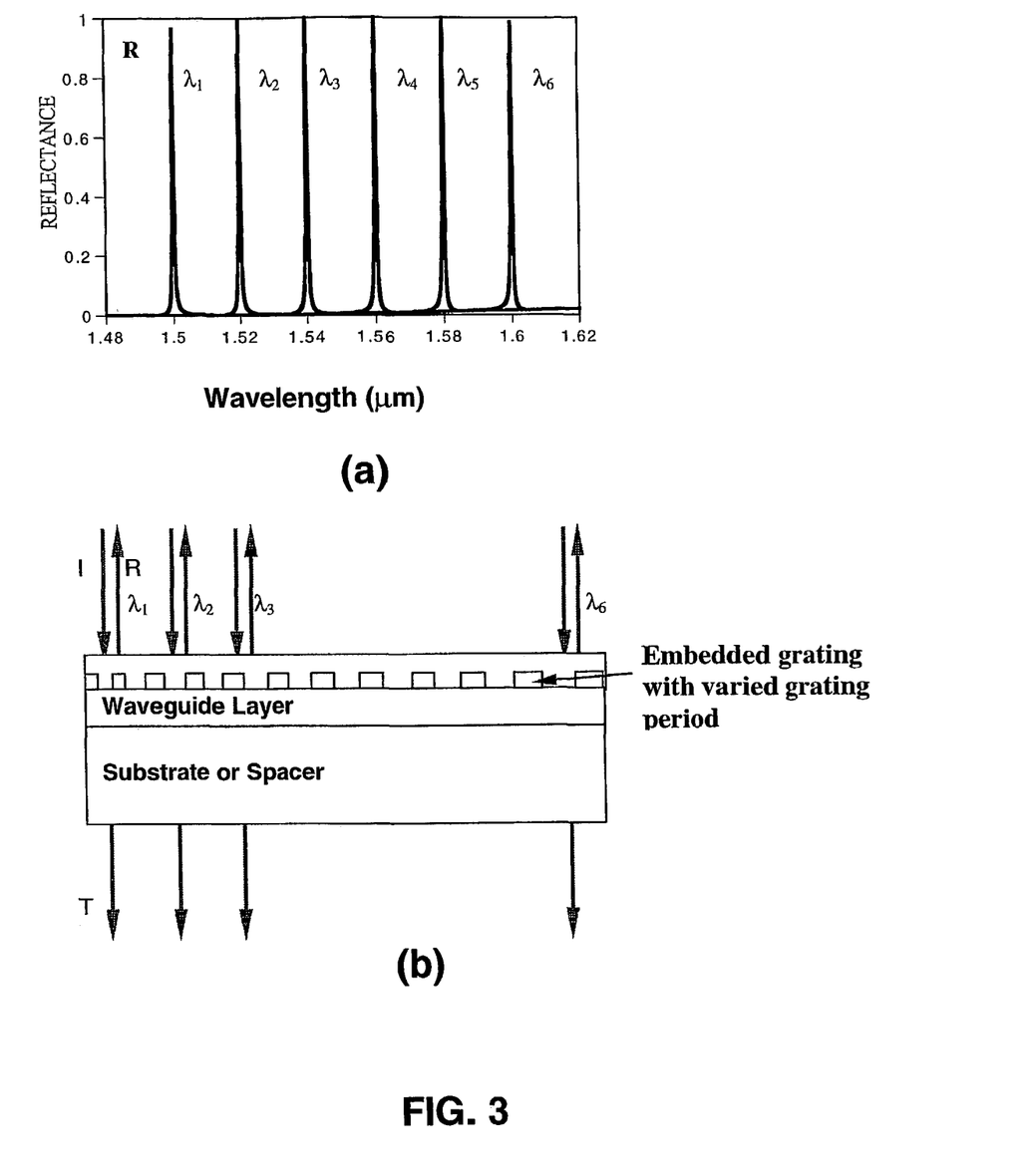
FIG. 3 illustrates reflection spectra predicted for a wavelength selectable optical device containing a grating layer with varied grating periods.

Theoretical reflection spectra of an optical device with non-uniform grating periods are shown in FIG. 3a. The device parameters used in the computation are as follows: refractive index of substrate or spacer=1.47, refractive index of the waveguide layer=2.4, refractive index of grating=2.0, refractive index of the material embedding the grating=1.5, thickness of the waveguide layer=350 nm, thickness of grating=50 nm, thickness of the embedding layer=300 nm (exclusive of the grating thickness), and grating periods varied from 718.5 nm to 775.1 nm (FIG. 3b). Peak reflection wavelengths can be anywhere from 1500 nm to 1600 nm. By designing a proper non-uniform grating period profile for a given laser-element geometry, it is possible to achieve evenly separated reflection peaks or desirable spacing combs.

Figure 4:
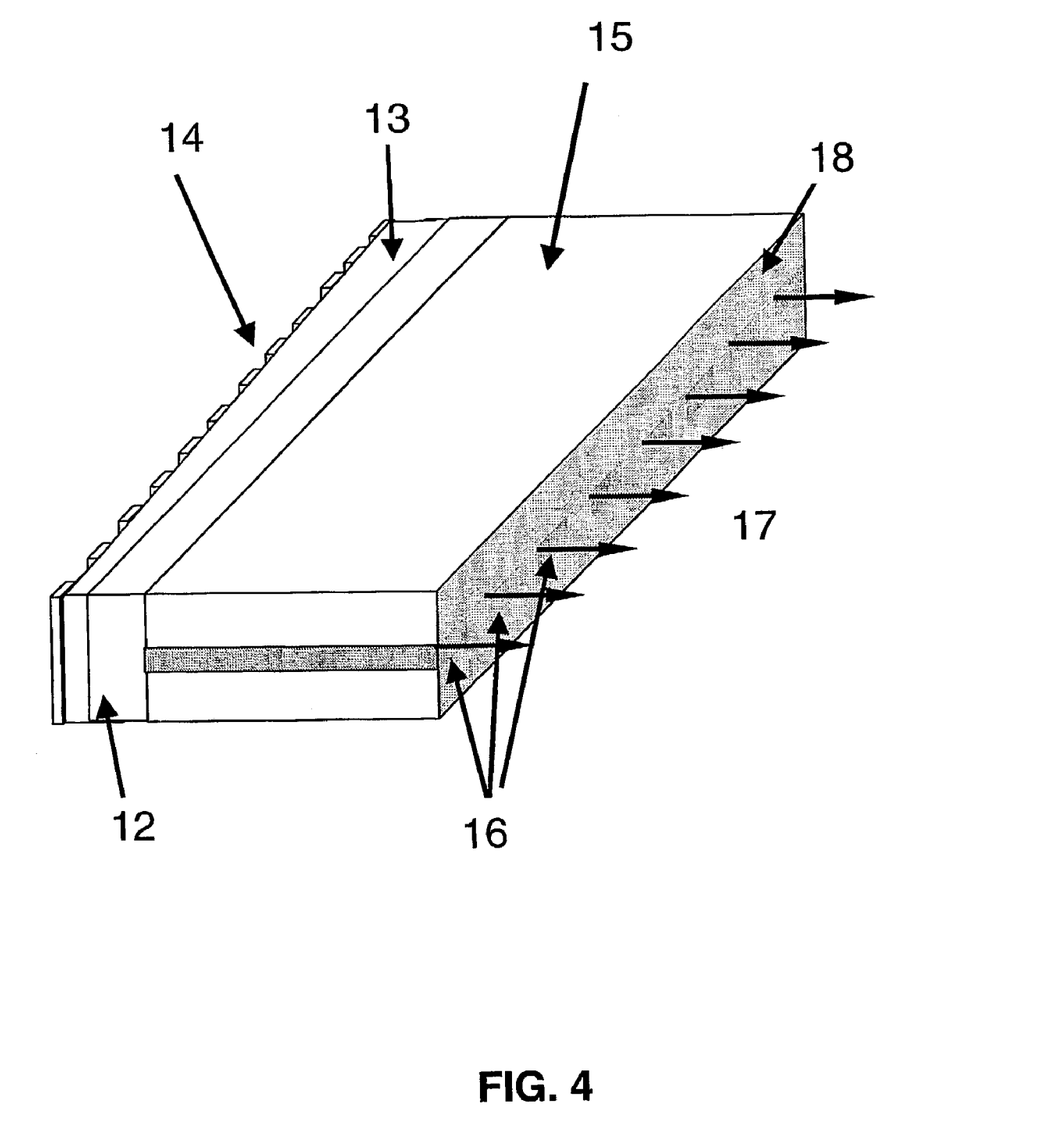
FIG. 4 illustrates a multi-wavelength laser array integrated with a wavelength selectable optical device.

FIG. 4 shows a multi-wavelength laser array, which is formed by integrating a wavelength selectable optical device in one of the emitting facets of a laser array. The output laser beams 17 from the laser array have different wavelengths because different sections of the optical device selectively feed back the lights at different wavelengths for laser resonance. Constrained by critical resonance conditions, each active laser element in the laser array has a single-mode, highly polarized, and narrow-linewidth laser output. Thus, the multi-wavelength laser array is achieved according to the present invention.

The number of the output wavelengths is identical to the number of the active elements in the array. The active elements are identical to each other except they are pointed or attached to the different local positions on the wavelength selectable optical device. Of course, the output wavelength range of the laser array must fall within the gain spectrum of the active elements.

The output wavelength spacing between two adjacent active elements depends upon the degree of the non-uniformity of the waveguide layer in its thickness and the distance between two adjacent active elements. These two parameters determine the difference in the waveguide thickness between the two adjacent active elements and thus determine the wavelength spacing. The wavelength spacing can be arbitrarily small because the difference in thickness between two adjacent active elements can be arbitrarily small.

The wavelength selectable optical device can be externally mounted to a laser array to achieve multi-wavelength outputs. In the embodiment shown in FIG. 5, an optical device 10 is aligned to a light-emitting facet of a laser array body 15 with a micro-lens array 30 placed between the optical device and the laser array body. FIG. 6 schematically illustrates a multi-wavelength laser array where a wavelength selectable optical device 10 is located on the surface of the laser array wafer 15 to achieve a configuration for surface emission.

All layers of the wavelength selectable optical device can be made of dielectric materials such as SiO2, Si3N4, HfO2, Al2O3, and TiO2 or semiconductor materials such as Si, InP, GaAs, AlGaAs, and InGaAsP. To improve the line shapes of its reflection spectra, the wavelength selectable optical device may further include any or all of the following three components: a dielectric thin-film layer on the outer surface of the grating layer, a dielectric thin-film layer between the grating layer and the waveguide layer, and a dielectric layer between the waveguide layer and the substrate.

The wavelength selectable optical device disclosed in the present invention is a passive element. No injection current flows through it. Thus, the local refractive indices in any sectional positions of the device are stable. Since the output wavelengths depend upon only the sectional positions of the device, the output wavelengths of the laser array will be stable even when injection currents or output powers of the active elements are varied. Furthermore, the device can be fabricated using materials with high thermal stability, thus the output wavelengths of the laser array are thermally stable as well.

In summary, by using a wavelength selectable optical device as a common feedback mirror in one of the end facets of a laser array with identical active elements, an MWL source is achieved. The outputs from the MWL array feature single-mode, narrow-linewidths, highly polarized beams, arbitrary wavelength spacing, high thermal and electrical stability, and low divergence. Those features make this invented laser array a good choice for generating laser sources for optical network, especially DWDM systems.

DESCRIPTION OF THE PREFERRED EMBODIMENTS

In one of the embodiments of the present invention, a wavelength selectable optical device is integrated in one of the laser-emitting facets of a laser array to achieve multi-wavelength outputs.

According to this embodiment (FIG. 4), the wavelength selectable optical device contains a space layer 12, a non-uniform waveguide layer 13, which is next to the space layer 12, and a grating layer 14 that has surface-relief or embedded grating. The waveguide layer 13 is non-uniform in its thickness or refractive index in a first direction. The refractive index of the spacer layer 12 is lower than that of the waveguide layer 13. Laser resonant cavities of this laser array are formed by a plurality of identical active elements 16, cleaved or polished or high-reflection thin-film stack coated facet 18, and the wavelength selectable optical device.

The wavelength selectable optical device is able to feed the lights from active elements 16 back to them at wavelengths depending upon the local positions along the first direction because the waveguide layer 13 has non-uniform thickness or refractive indices along the first direction. When the lights from the active elements 16 strike the optical device at different positions, only the lights at selected wavelengths are fed back to the laser cavities. Thus, the active elements 16 are able to emit laser beams with different wavelengths as long as each of the wavelengths is within the gain curve of the corresponding active element. When the materials for constructing the device are given, the output wavelength from each active element depends upon, among other factors, the local grating periods of the grating layer 14 and the local thickness of the waveguide layer 13. The optical device can be designed so that all output wavelengths are within the gain spectrum of the active medium used in the laser array. The space layer 12 should be thick enough so that the resonant modes corresponding guided-mode resonance are efficiently confined to the waveguide layer 13.

Figure 5:
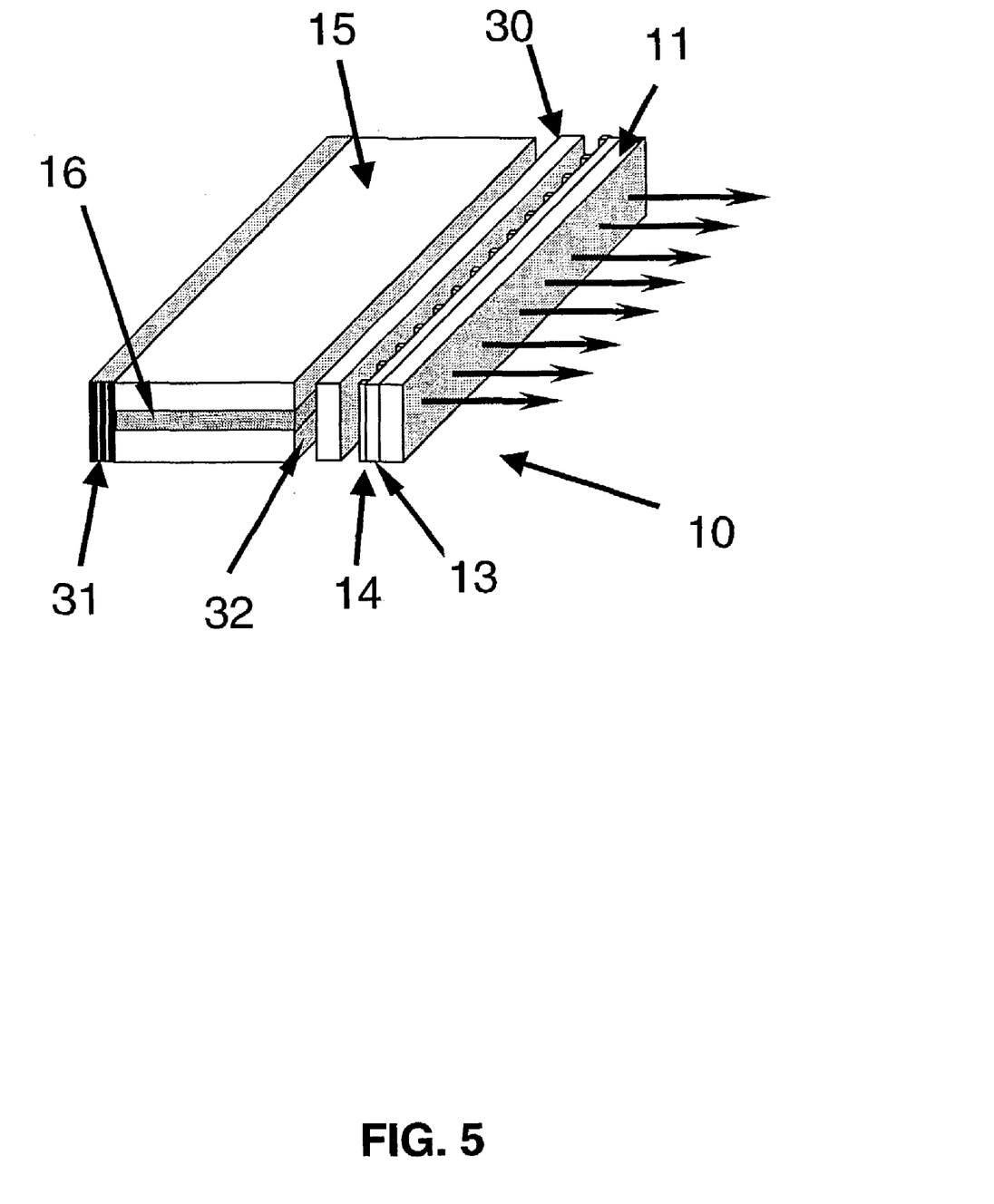
FIG. 5 illustrates a multi-wavelength laser array with an externally mounted wavelength selectable optical device and a micro-lens array.
Figure 6:
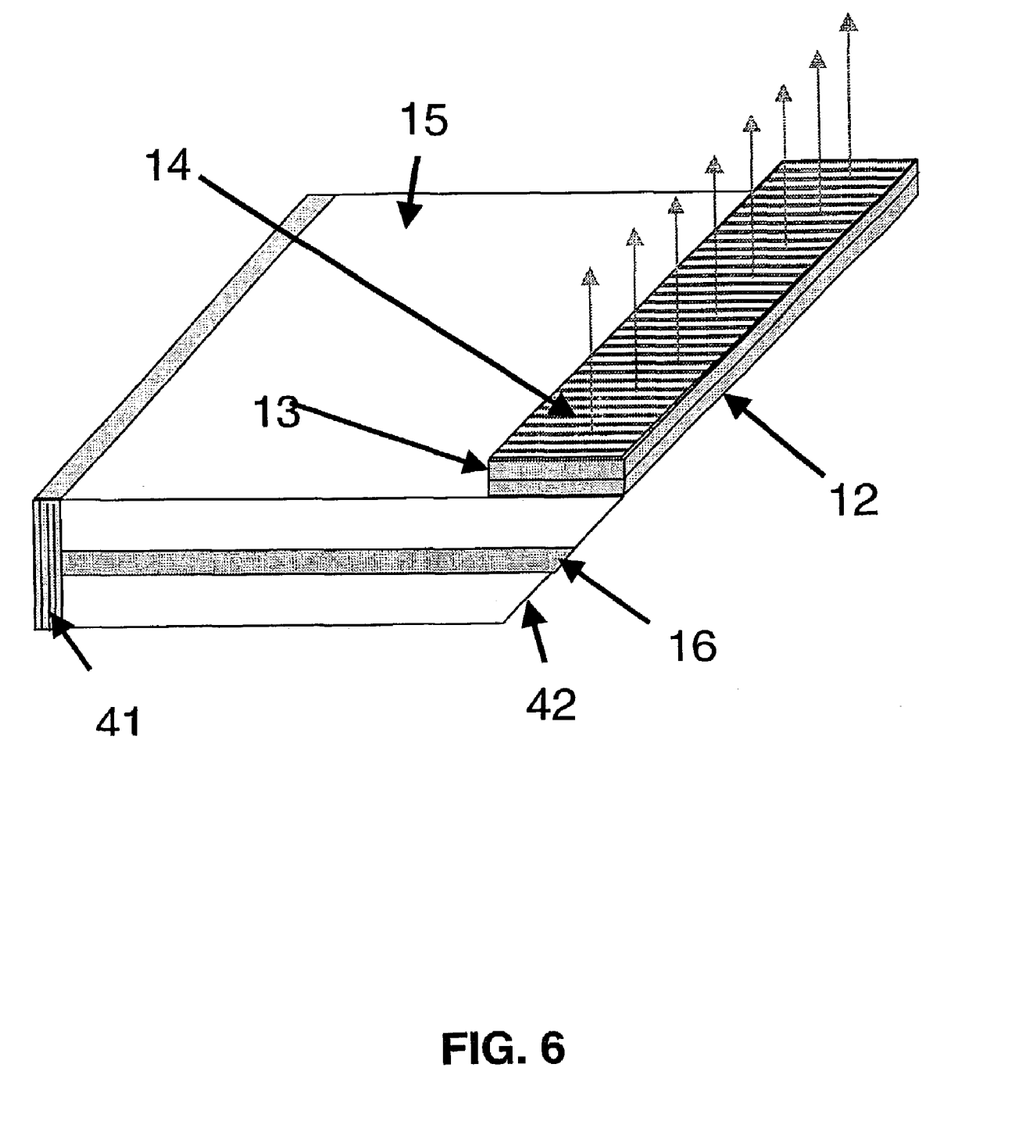
FIG. 6 illustrates a multi-wavelength laser array with a surface-mounted wavelength selectable optical device.

In the second embodiment of the invention shown in FIG. 5, a wavelength selectable optical device is externally aligned to a laser array to achieve multi-wavelength outputs. The MWL array in this embodiment is formed by a body 15, a plurality of identical active elements 16, a high-reflection coating 31 on one of the common facets of the body, a micro-lens array 30 on the other side of the body, and a wavelength selectable optical device 10. Similarly, the optical device 10 contains a substrate 11, a non-uniform waveguide layer (thickness varied or refractive index varied) 13, and a grating layer 14. The number of the micro-lenses in the lens array 30 is equal to the number of the active elements 16, and the distance between two adjacent lenses is the same as that of two adjacent active elements 16. The micro-lens array 30 is aligned with one of the common emitting facets of the active elements 16 so that the light emitted from each of the active elements 16 is collimated by a corresponding micro-lens in the micro-lens array 30. When the lights reach the optical device 10, they are partially reflected back at certain wavelengths by the corresponding sections of the optical device 10. The reflected lights are then focused by the micro-lens array 30 and fed back into the active elements 16 to complete round-trip resonance. The optical device 10 is designed with a reflectivity less than 100% so that it also functions as laser output couplers.

In another embodiment shown in FIG. 6, a wavelength selectable optical device 10 is placed on the top surface of the laser array body 15 so that it is able to emit laser beams from the wafer surface.

In this embodiment, the wavelength selectable optical device 10 contains a spacer 12 (equivalent to a substrate of a standalone wavelength selectable optical device), a non-uniform waveguide layer 13 on top of the spacer layer 12, and a grating layer 14 that has surface-relief or embedded grating. The refractive index of the spacer layer 12 is lower than that of the waveguide layer 13, which has varying thickness or refractive indices in a first direction. Inside the laser array body 15 are a plurality of identical active elements 16, a highly reflective thin-film stack coated facet 41 (with its reflectivity close to 100%), and a 45-degree polished facet 42.

Laser resonant cavities in this embodiment are formed by the high-reflection facet 41, the active elements 16, the polished facet 42, and the optical device 10. The polished facet 42 is able to bend the light from each of the active elements 16 by 90 degrees. The bent light then strikes the optical device 10 in a corresponding position, which feeds the light back at a selected wavelength. When the light reaches the facet 42 again, it is bent again, traveling back into the active element 16. Since the reflectivity of the coated facet 41 is close to 100%, the light emitted from this facet is negligible. The optical device 10 located on the wafer surface can be designed with reflectivity less than 100% so that it also functions as laser output couplers. Thus, emission of laser lights from the surface of the wafer is achieved. For the same reasons discussed for the first embodiment, the outputs contain MWL beams. This structure is suitable for mass production. The 45-degree polished facet 42 can be curved so that the lights are well confined in the laser cavities during laser operation.

Figure 7:
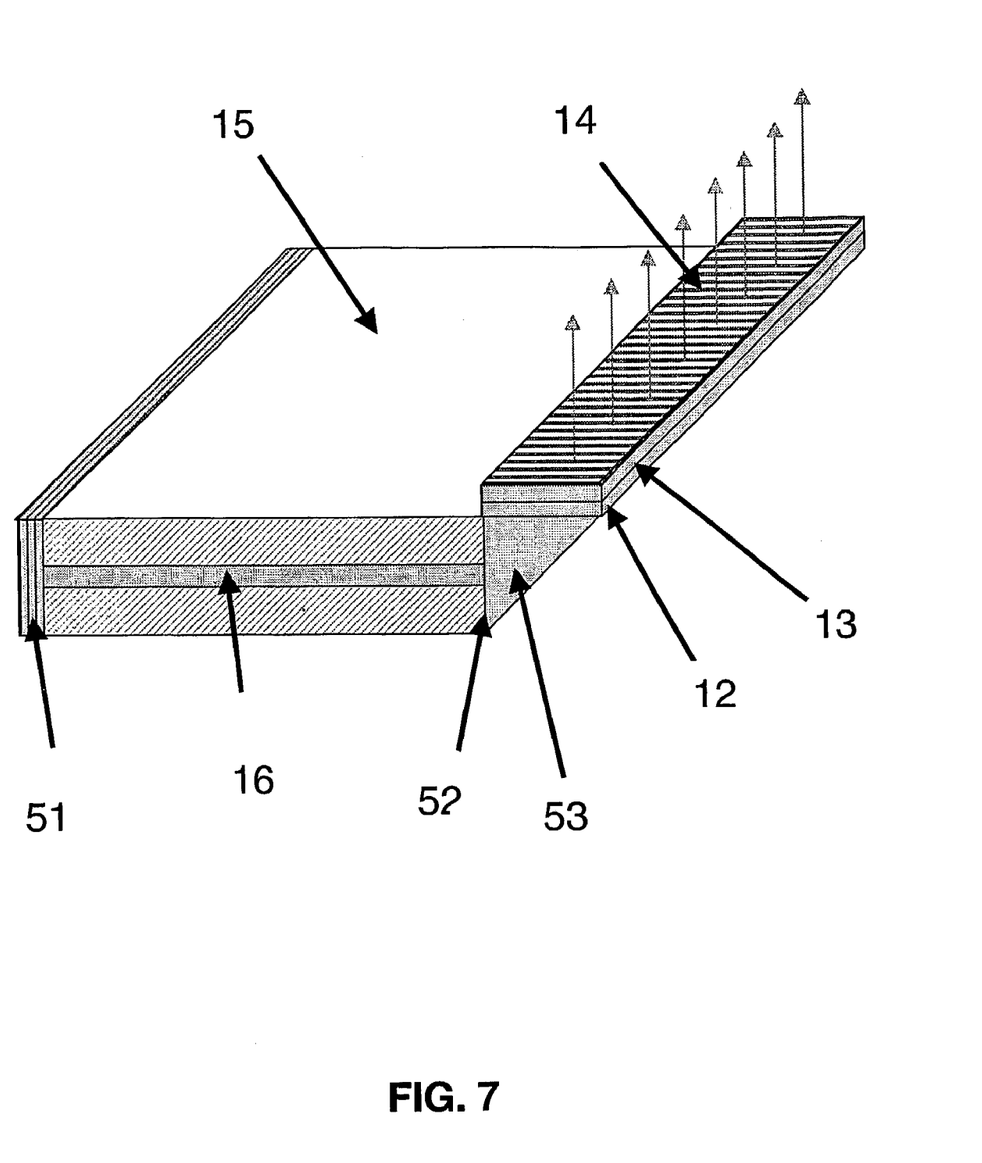
FIG. 7 illustrates a multi-wavelength laser array with an externally mounted wavelength selectable optical device fabricated on a 45-degree prism.

FIG. 7 shows another embodiment where its structure is very similar to that of the embodiment having the configuration for surface emission except that a 45-degree prism 53 is used to join emitting facet 52 with a wavelength selectable optical device 10. The laser cavities of this array system are formed by a highly reflective facet 51, active elements 16, the 45-degree prism 53, and the optical device 10.

Application of the Laser Array

A laser array using a wavelength selectable optical device may serve as a laser source for DWDM systems. The disclosed MWL array in this invention features compact size, high stability in output wavelengths and wavelength spacing, broad wavelength selectivity, convenience of use, and low costs for mass production. When a fixed manufacturing process is developed for mass production, individual units are expected to achieve uniform performance characteristics. By designing the profile of non-uniform parameters for a wavelength selectable optical device, each reflection wavelength for a corresponding active element can be locked into a particular wavelength channel. For a wavelength selectable optical device that is designed to have a linear relation between its reflection wavelength and its local position, the output wavelengths may be shifted by changing the position of the optical device relevant to the active elements. This method may be useful in some situations to correct errors in designing and fabricating the optical device.

The wavelength selectable optical device can be fabricated using existing techniques. Fabrication of grating on a surface is an art known by those skilled in the art. Typical techniques include holographic interference, phase mask, electron beam writing, and laser-beam writing. Electron beam writing and laser-beam writing can be used to fabricate gratings with varying grating periods. Thin film deposition, a well-known technique, can be used for fabrication of the waveguide layer. Taped or stepped waveguide layer can be fabricated by using thin film deposition technique in combination with a precisely controlled moving mask on the deposited surface. Perhaps, selective etching process may be used to create non-uniform structures (U.S. Pat. No. 6,309,975 to Wu, et al.). Layers with non-uniform indices may be made by thin-film deposition using two or more material sources. Other components such as active elements and power suppliers are also commercially available.

In those exemplary embodiments of the invention, specific components, arrangements, and assemble processes are used to describe the invention. Obvious changes, modifications, and substitutions may be made by those skilled in the art to achieve the same results of this invention. The exemplary embodiments are, of course, merely examples and are not intended to limit the scope of the invention. It is intended that the present invention cover all other embodiments that are within the scope of the appended claims and their equivalents.

What is claimed is:

1. An optical device comprising:
   a substrate;
   a waveguide layer on the substrate;
   a grating layer on the waveguide layer; and
   means for varying reflection wavelength along a first direction of the waveguide, the means being selected from the group consisting of non-uniform thickness of the waveguide layer along the first direction, non-uniform material composition for achieving different refractive indexes in the waveguide layer along the first direction, and combination thereof.

2. The optical device of claim 1 wherein the waveguide layer is made of a material selected from a group consisting of dielectric materials and semiconductor materials.

3. The optical device of claim 2 wherein the material of the waveguide layer is selected from a group consisting of SiO2, Si3N4, HfO2, Al2O3, TiO2, Si, InP, GaAs, AlGaAs, and InGaAsP.

4. The optical device of claim 3 further comprising a dielectric layer selected from a group consisting of a dielectric layer on the outer surface of the grating layer and a dielectric layer between the substrate and the waveguide layer.

5. The optical device of claim 2 further comprising a dielectric layer selected from a group consisting of a dielectric layer on the outer surface of the grating layer and a dielectric layer between the substrate and the waveguide layer.

6. The optical device of claim 1 further comprising a dielectric layer selected from a group consisting of a dielectric layer on the outer surface of the grating layer and a dielectric layer between the substrate and the waveguide layer.

7. The optical device of claim 6 wherein the waveguide layer is made of a material selected from a group consisting of SiO2, Si3N4, HfO2, Al2O3, TiO2, Si, InP, GaAs, AlGaAs, and InGaAsP.

8. The optical device of claim 1 further comprising a dielectric layer on the outer surface of the grating layer and a dielectric layer between the substrate and the waveguide layer.

9. The optical device of claim 8 wherein the waveguide layer is made of a material selected from a group consisting of SiO2, Si3N4, HfO2, Al2O3, TiO2, Si, InP, GaAs, AlGaAs, and InGaAsP.

10. The optical device of claim 1 wherein the waveguide layer is made from a material selected from a group consisting of SiO2, Si3N4, HfO2, Al2O3, TiO2, Si, InP, GaAs, AlGaAs, and InGaAsP.

11. A laser system comprising:
a body having a first surface on one side of the body and a second surface on the opposite side of the body;
a plurality of substantially parallel active elements arranged in the form of one-dimensional array in the body, each active element having one end facet falling in the first surface of the body and the other end facet falling in the second surface of the body, the plane formed by the central lines between two end facets of the active element being perpendicular to the second surface;
an optical device being capable of selectively reflecting the lights from the active elements back to the active elements, the optical device comprising: a substrate; a waveguide layer on the substrate; a grating layer on the waveguide layer; and means for varying reflection wavelengths along a first direction of the waveguide layer, the optical device being substantially parallel with the first surface of the body whereby the lights from the active elements are able to strike the optical device at different positions along the first direction during laser operation; and
means for coupling laser beams from the laser system for outputs.

12. The laser system of claim 11 wherein the means for varying reflection wavelengths is selected from a group consisting of non-uniform thickness of the waveguide layer along the first direction, non-uniform refractive index of the waveguide layer along the first direction, non-uniform grating periods in the grating layer along the first direction, and combinations thereof.

13. The laser system of claim 12 wherein the substrate serves as a spacer layer for attaching the optical device onto the first surface of the body, the second surface is polished to function as the means for coupling laser beams from the laser system for outputs.

14. The laser system of claim 13 further comprising a dielectric layer selected from a group consisting of a dielectric layer on the surface of the grating layer and a dielectric layer between the substrate and the waveguide layer.

15. The laser system of claim 14 further comprising a plurality of independent tunable power supplies.

16. The laser system of claim 12 further comprising a dielectric layer selected from a group consisting of a dielectric layer on the surface of the grating layer and a dielectric layer between the substrate and the waveguide layer.

17. The laser system of claim 16 further comprising a plurality of independent tunable power supplies.

18. The laser system of claim 12 further comprising a plurality of independent tunable power supplies.

19. The laser system of claim 11 further comprising a dielectric layer selected from a group consisting of a dielectric layer on the surface of the grating layer and a dielectric layer between the substrate and the waveguide layer.

20. The laser system of claim 19 further comprising a plurality of independent tunable power supplies.

21. The laser system of claim 11 further comprising a plurality of independent tunable power supplies.

22. A laser system comprising:
a body having a first surface on one side of the body and a second surface on the opposite side of the body;
a plurality of substantially mutually-parallel active elements arranged inside the body in the form of one-dimensional array, each active element having one end facet falling in the first surface and the other end facet falling in the second surface of the body, a plane formed by the central lines between two end facets of the active elements being perpendicular to the second surface of the body;
an optical device comprising: a substrate; a waveguide layer on the substrate; a grating layer on the waveguide layer; and means for varying reflection wavelengths along a first direction of the waveguide layer; and
means for sending the lights from the active elements to the optical device during laser operation, forming oscillation cavities for the laser system; and
means for coupling laser beams from the laser system for outputs.

23. The laser system of claim 22 wherein the means for varying reflection wavelengths is selected from a group consisting of non-uniform thickness of the waveguide layer along the first direction, non-uniform refractive index of the waveguide layer along the first direction, non-uniform grating periods in the grating layer along the first direction, and combinations thereof.

24. The laser system of claim 23 further comprising a substantially totally reflective coating on the second surface of the body, wherein the first surface of the body is formed so that its growth plane intercepts the growth plane of the second surface at substantially 45 degrees, forming an imaginary interception line; the first surface of the body is polished; the active elements are arranged so that the plane formed by the central lines between end facets of the active elements is substantially parallel with the imaginary interception line whereby the first surface is able to function as the mean for sending the lights from the active elements by reflecting them by about 90 degrees during laser operation; the optical device is located on a portion of the body close to the first surface so that the lights reflected from the first surface of the body are substantially normal to the central plane of the waveguide layer; and the optical device functions as the means for coupling laser beams from the laser system for outputs.

25. The laser system of claim 24 further comprising a plurality of independent tunable power supplies.

26. The laser system of claim 25 wherein the waveguide layer is made of a material selected from a group consisting of SiO2, Si3N4, HfO2, Al2O3, TiO2, Si, InP, GaAs, AlGaAs, and InGaAsP.

27. The laser system of claim 24 wherein the first surface of the body is curved so that it is able to collimate the lights from active elements for better light confinement during laser operation.

28. The laser system of claim 23 wherein the first surface of the body is parallel to the second surface of the body; the mean for sending lights is a 45-degree prism that has a first plane, a second plane substantially perpendicular to the first plane, and a third plane that intercepts with the first plane and the second plane; the prism is arranged with its first plane being parallel with the first surface of body and its second plane parallel with the plane formed by the central lines between end facets of the active elements; the optical device is located on the second surface of the prism whereby the prism is able to reflect the lights from the active elements during laser operation; and the optical device functions as the means for coupling laser beams from the laser system for outputs.

29. The laser system of claim 28 further comprising a plurality of independent tunable power supplies.

30. The laser system of claim 23 wherein the first surface of the body is substantially parallel with the second surface of the body, the optical device is assembled with its grating surface close to the first surface of the body, the means for sending the lights from the active elements is a plurality of micro lens located between the first surface of the body and the grating surface of the optical device, and the optical device functions as the means for coupling laser beams from the laser system for outputs.

31. The laser system of claim 30 further comprising a plurality of independent tunable power supplies.

32. The laser system of claim 23 wherein the waveguide layer is made from a material selected from a group consisting of SiO2, Si3N4, HfO2, Al2O3, TiO2, Si, InP, GaAs, AlGaAs, and InGaAsP.

33. The laser system of claim 32 further comprising a plurality of independent tunable power supplies.

34. The laser system of claim 22 further comprising a dielectric layer selected from a group consisting of a dielectric layer on the outer surface of the grating layer and a dielectric layer between the substrate and the waveguide layer.

35. The laser system of claim 34 further comprising a plurality of independent tunable power supplies.

36. A method for generating laser outputs comprising:

exciting a plurality of active elements;

reflecting the lights from active elements by an optical device on a first common end of the active elements back to the active elements, the optical device comprising: a substrate; a waveguide layer on the substrate; a grating layer on the waveguide layer; and means for varying reflection wavelengths along a first direction of the waveguide layer;

reflecting the lights from the active elements by a reflective layer on a second common end of the active elements; and coupling a plurality of laser beams for outputs.

37. The method of claim 36 wherein the means for varying reflection wavelengths is selected from a group consisting of non-uniform thickness of the waveguide layer along the first direction, non-uniform refractive index of the waveguide layer along the first direction, non-uniform grating periods in the grating layer along the first direction, and combinations thereof.

38. The method of claim 36 wherein the plurality of active elements are excited at various power levels.

39. The means for varying reflection wavelength of claim 1 further comprising non-uniform grating periods on the waveguide along the first direction.

40. The optical device of claim 39 further comprising a dielectric layer selected from a group consisting of a dielectric layer on the outer surface of the grating layer and a dielectric layer between the substrate and the waveguide layer.

41. The optical device of claim 39 further comprising a dielectric layer on the outer surface of the grating layer and a dielectric layer between the substrate and the waveguide layer.

* * * * *